(12) United States Patent
Hayashi

(10) Patent No.: US 6,953,718 B2
(45) Date of Patent: Oct. 11, 2005

(54) METHOD FOR MANUFACTURING SEMICONDUCTOR DEVICE

(75) Inventor: Masahiro Hayashi, Sakata (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/392,343

(22) Filed: Mar. 19, 2003

(65) Prior Publication Data

US 2003/0235960 A1 Dec. 25, 2003

(30) Foreign Application Priority Data

Mar. 22, 2002 (JP) .................................... 2002-081189

(51) Int. Cl.$^7$ ........................................ H01L 21/8238
(52) U.S. Cl. ...................... 438/199; 438/217; 438/224
(58) Field of Search ................... 438/188, 195, 438/199, 217, 220, 223, 224, 227, 228; 257/E27.067, E29.016

(56) References Cited

U.S. PATENT DOCUMENTS

| | | | | |
|---|---|---|---|---|
| 5,043,778 A | * | 8/1991 | Teng et al. ................. | 257/374 |
| 5,420,062 A | * | 5/1995 | Inada et al. ................. | 438/228 |
| 5,429,958 A | * | 7/1995 | Matlock ..................... | 438/218 |
| 6,143,594 A | * | 11/2000 | Tsao et al. .................. | 438/199 |
| 2002/0058369 A1 | * | 5/2002 | Ju, II ........................ | 438/199 |
| 2003/0040148 A1 | * | 2/2003 | Nandakumar et al. ...... | 438/199 |

FOREIGN PATENT DOCUMENTS

| | | |
|---|---|---|
| JP | 01-268171 | 10/1989 |
| JP | 07-078881 | 3/1995 |
| JP | 08-274268 | 10/1996 |
| JP | 2000-286346 | 10/2000 |
| JP | 2000-294742 | 10/2000 |
| JP | 2001-291678 | 10/2001 |
| JP | 2001-291679 | 10/2001 |
| JP | 2001-291786 | 10/2001 |

OTHER PUBLICATIONS

Wolf and Tauber; "Silicon Processing for the VLSI Era vol. 1: Process Technology"; p. 242; 1986 Lattice Press; Sunset Beach, CA.*

* cited by examiner

Primary Examiner—George Fourson
Assistant Examiner—Fernando L. Toledo
(74) Attorney, Agent, or Firm—Harness, Dickey & Pierce, P.L.C.

(57) ABSTRACT

A method is provided for manufacturing a semiconductor device having a high breakdown voltage transistor and a low breakdown voltage transistor with different driving voltages in a common substrate. A method for manufacturing the semiconductor device includes: (a) forming a first well including an impurity of a second conductivity type in a specified region of a semiconductor substrate of a first conductivity type; (b) forming a first impurity layer in a specified region of the first well by introducing an impurity of the first conductivity type by ion implantation; (c) forming a second impurity layer in a specified region of a semiconductor layer of the first conductivity type by introducing an impurity of the second conductivity type by ion implantation; and (d) diffusing impurities of the first impurity layer and the second impurity layer by a heat treatment to form a second well of the first conductivity type in the first well, and forming well-shaped offset layers of a source/drain layer of the second conductivity type.

8 Claims, 9 Drawing Sheets

METHOD FOR MANUFACTURING SEMICONDUCTOR DEVICE

TECHNICAL FIELD

The present invention relates to a method for manufacturing a semiconductor device having a high breakdown voltage transistor and a low breakdown voltage transistor in a common semiconductor substrate.

BACKGROUND

A liquid crystal panel driver LSI and a CCD driver LSI, for example, are operated at a power supply voltage of 10V or higher, and therefore high breakdown voltage transistors having a breakdown voltage of 20V or higher are normally required. On the other hand, low breakdown voltage transistors are used in internal control logic sections that need to be small in size and operated at high speeds. The wells where high breakdown voltage transistors are formed tend to be made deeper, and their surface impurity concentration lowered in order to secure the well breakdown voltage. In contrast, wells where low breakdown voltage transistors are formed are tend to be made shallower, and their surface impurity concentration increased in order to reduce the element size and to achieve higher speeds. For this reason, high breakdown voltage transistors are formed in a chip that is independent from a chip for low breakdown voltage transistors, and known to be formed as an externally mounted circuit.

An object of the present invention is to provide a method for manufacturing a semiconductor device having a high breakdown voltage transistor and a low breakdown voltage transistor with different driving voltages provided in a common substrate.

SUMMARY

A simplified method for manufacturing a semiconductor device in accordance with the present invention includes simultaneously forming a triple well and a well-shaped offset layer having a double drain. This is accomplished by first forming a first well including an impurity of a second conductivity type in a semiconductor substrate of a first conductivity type. First and second impurity layers having first and second conductivity types, respectively, are formed in the first well by introducing an impurity of the first conductivity type by an ion implantation. Impurities of the first and second impurity layers are diffused by a heat treatment in a single step to form multiple wells inside the first well. Additionally, well-shaped offset layers of source/drain layers of the second conductivity type can be formed simultaneously.

By the manufacturing method of the present invention, since the second well (that forms a triple well), and a well-shaped offset layer having a double drain (DDD: Double Diffused Drain) structure can be simultaneously formed, the process can be simplified.

In the present invention, a third impurity layer may be formed in a specified region of the first well by introducing an impurity of the second conductivity type by an ion implantation, and the impurity of the third impurity layer may be diffused by the heat treatment of step (d), to form a fourth well of the second conductivity type in the first well.

In the present invention, an offset layer that is composed of an impurity layer of the second conductivity type and shallower than the well-shaped offset layer may be formed at least between the source/drain layer and a channel region. The offset layer may be formed by forming an impurity layer by introducing an impurity of the second conductivity type in a specified region of the semiconductor substrate, and then forming a dielectric layer over the impurity layer by selective oxidation. Such an offset layer sufficiently increases the drain breakdown voltage coupled with the double diffused drain structure.

In the present invention, a low breakdown voltage transistor of the second conductivity type may be formed in the third well, a low breakdown voltage transistor of the first conductivity type may be formed in the fourth well, a high breakdown voltage transistor of the first conductivity type may be formed in the first well, and a high breakdown voltage transistor of the second conductivity type may be formed in the second well.

DETAILED DESCRIPTION

An embodiment of the present invention will be described below with reference to the accompanying drawings.

FIGS. 1–9 schematically show cross-sectional views indicating a method for manufacturing a semiconductor device in accordance with the present embodiment.

Figure 1:
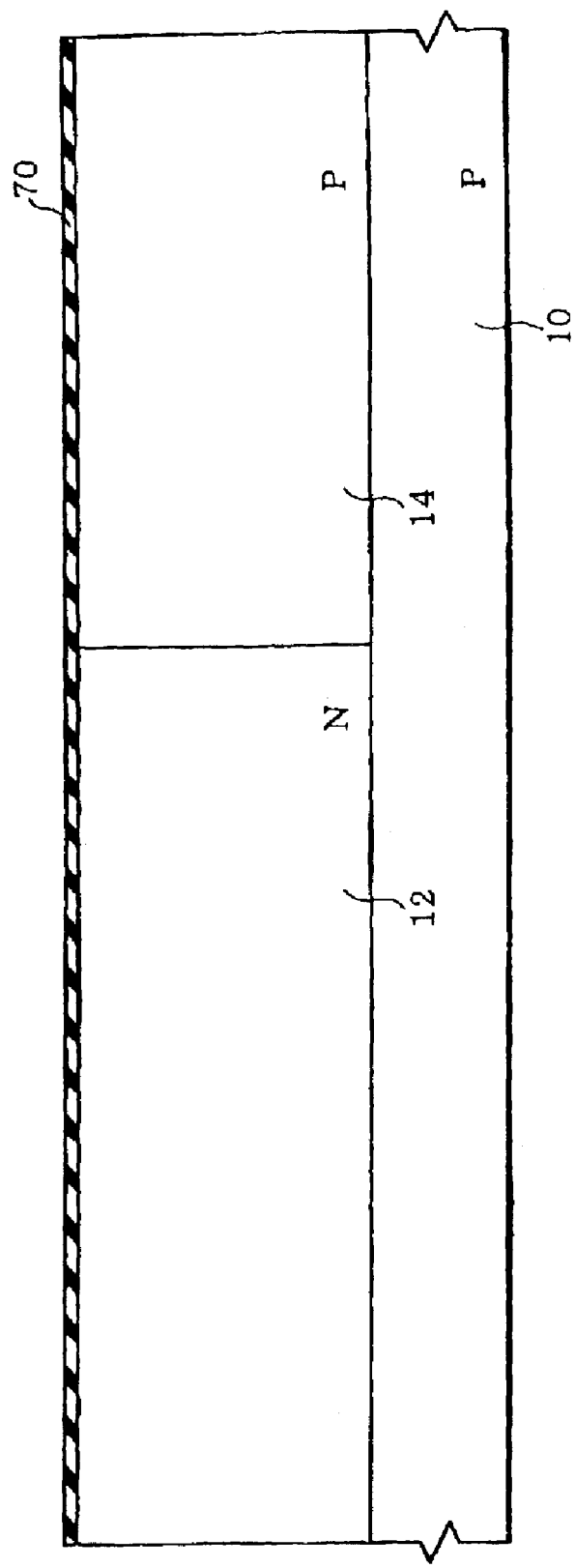
FIG. 1 shows a cross-sectional view illustrating a method for manufacturing a semiconductor device in the process order in accordance with an embodiment of the present invention.

(A) As shown in FIG. 1, a first well 12 of a second conductivity type (N-type in this example) and a P-type second well 14 are formed in a semiconductor substrate 10

(e.g., silicon) of a first conductivity type (P-type in this example). The first well 12 and the second well 14 can be formed by a known method. In FIG. 1, reference numeral 70 denotes a silicon oxide layer.

Figure 2:
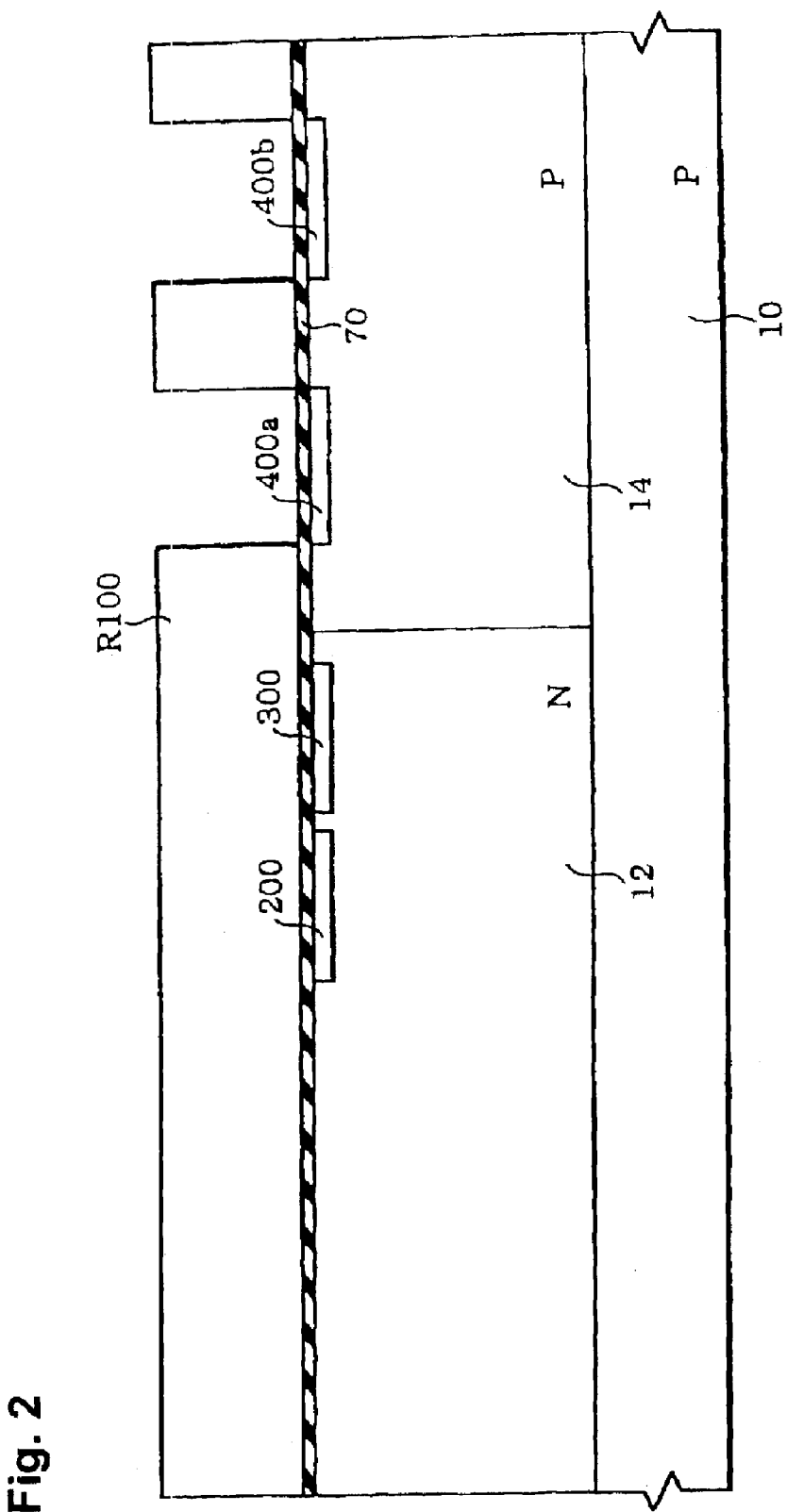
FIG. 2 shows a cross-sectional view illustrating the method for manufacturing a semiconductor device in the process order in accordance with the embodiment of the present invention.

(B) As shown in FIG. 2, a P-type impurity layer (first impurity layer) 200 and an N-type impurity layer (third impurity layer) 300 are formed in the first well 12 by implanting ions. Also, N-type impurity layers (second impurity layers) 400a and 400b are formed in the second well 14. The impurity layers may be formed, for example, by the following method. A resist layer R100 having opening sections at positions corresponding to regions where impurity layers are to be formed is formed over the silicon oxide layer 70. In the illustrated example, by using the resist layer R100 as a mask, phosphorus ions are implanted in specified regions in the P-type second well 14 through the silicon oxide layer 70, to form the N-type impurity layers 400a and 400b.

Figure 3:
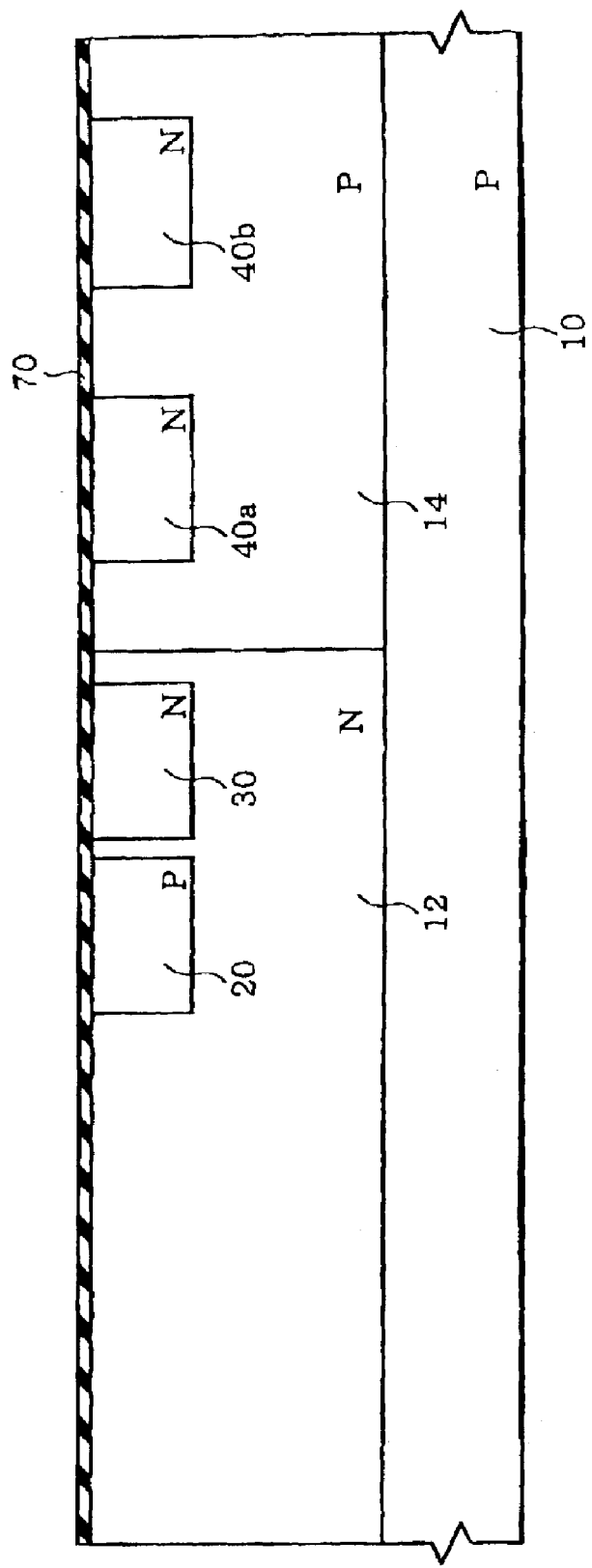
FIG. 3 shows a cross-sectional view illustrating the method for manufacturing a semiconductor device in the process order in accordance with the embodiment of the present invention.

(C) As shown in FIG. 2 and FIG. 3, after removing the resist layer R100, impurities in the P-type impurity layer 200, the N-type impurity layer 300 and the N-type impurity layers 400a and 400b are simultaneously diffused (driven in) by a heat treatment, to form a P-type third well 20, an N-type fourth well 30 and N-type well-shaped offset layers 40a and 40b.

In this manner, the N-type first well 12 and the P-type second well 14 in contact with the first well 12 are formed in the P-type semiconductor substrate 10. The P-type third well 20 and the N-type fourth well 30 are formed within the first well 12. The first well 12 and the third well 20 form a triple well. Furthermore, well-shaped offset layers 40a and 40b of the source/drain layers (hereafter referred to as "N-type first offset layers 40a and 40b") are formed in the second well 14.

Figure 4:
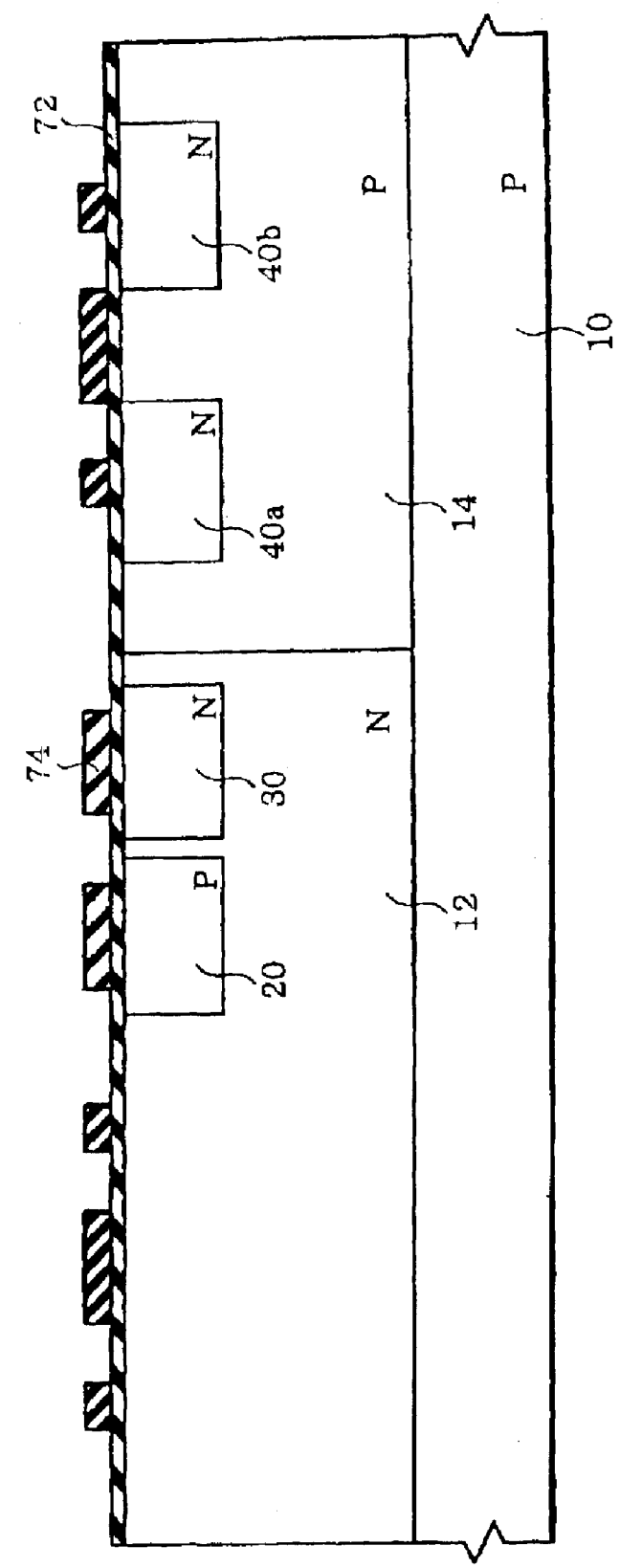
FIG. 4 shows a cross-sectional view illustrating the method for manufacturing a semiconductor device in the process order in accordance with the embodiment of the present invention.

(D) As shown in FIG. 4, after removing the silicon oxide layer 70 that has become thick by the heat treatment, the semiconductor substrate 10 is thermally oxidized to form a silicon oxide layer 72 having a thickness of about 40 nm on a surface of the semiconductor substrate 10. Thereafter, a silicon nitride layer 74 having a thickness of 140 nm–160 nm is formed as an anti-oxidation layer on the silicon oxide layer 72. Then, a resist layer (not shown) is formed on the silicon nitride layer 74, and the silicon nitride layer 74 is etched and patterned using the resist layer as a mask.

The silicon nitride layer 74 functions as a mask layer in a selective oxidation step to be conducted later, and also functions as a mask at the time of introducing impurities in the wells.

Figure 5:
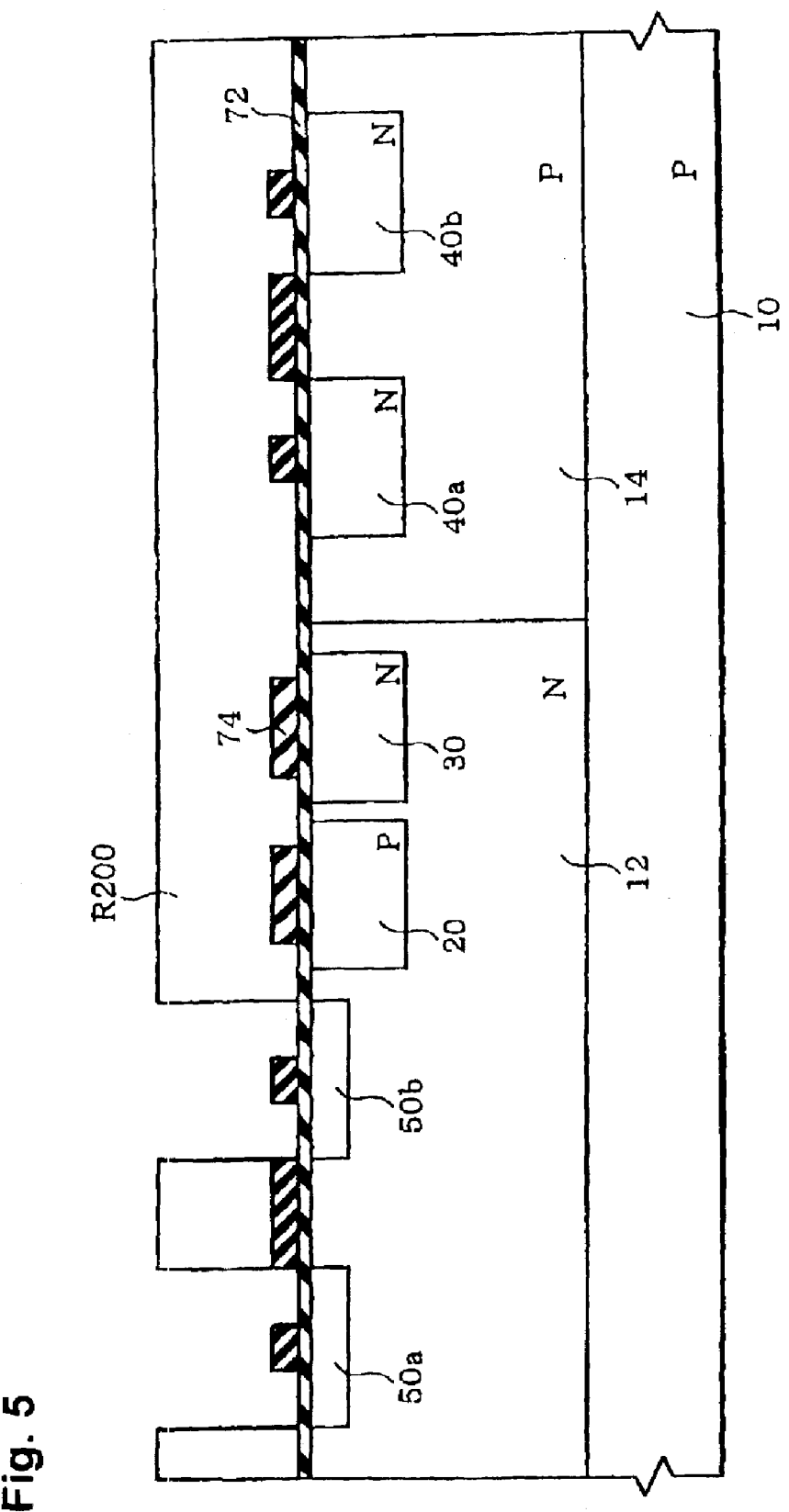
FIG. 5 shows a cross-sectional view illustrating the method for manufacturing a semiconductor device in the process order in accordance with the embodiment of the present invention.

(E) As shown in FIG. 5, a resist layer R200 having open sections corresponding to specified regions in the first well 12 is formed. Then, by using the resist layer R200 as a mask, a P-type impurity is introduced in the specified regions in the first well 12 by implanting ions to form impurity layers 50a and 50b. The impurity layers 50a and 50b become first offset layers of the P-type source/drain layers through a heat treatment to be conducted later. Hereafter, the first offset layers are assigned reference numbers 50a and 50b, respectively.

Figure 6:
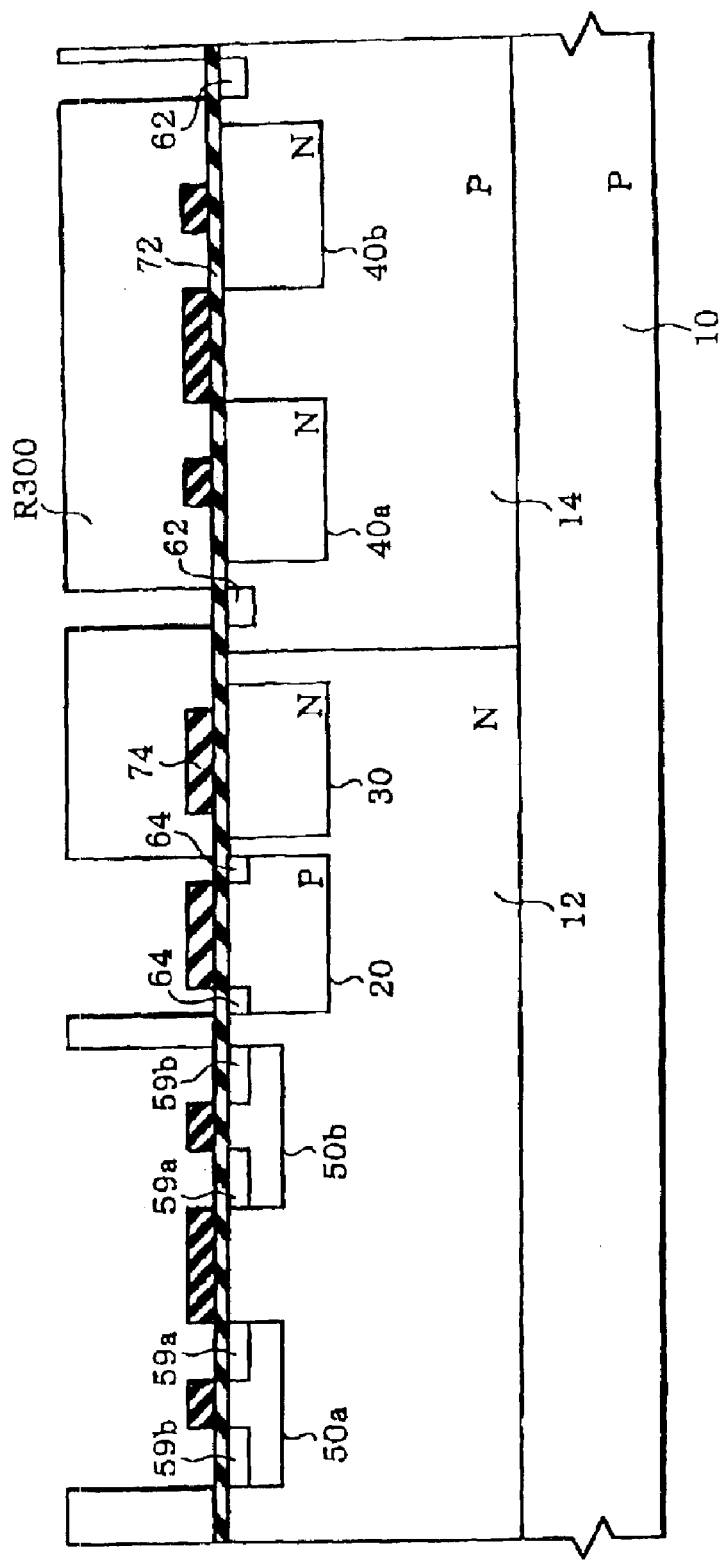
FIG. 6 shows a cross-sectional view illustrating the method for manufacturing a semiconductor device in the process order in accordance with the embodiment of the present invention.

(F) As shown in FIG. 6, for example, boron ions are implanted in the semiconductor substrate 10 using the resist layer R300 and the silicon nitride layer 74 having specified patterns as masks to form P-type impurity layers. The impurity layers that are formed in this step compose offset layers (hereafter referred to as "second offset layers") 59a that are shallower than the first offset layers 50a and 50b, shallow impurity layers 59b adjacent to the source/drain layers, channel stopper layers 64 in the third well 20, and channel stopper layers 62 in the second well 14.

Figure 7:
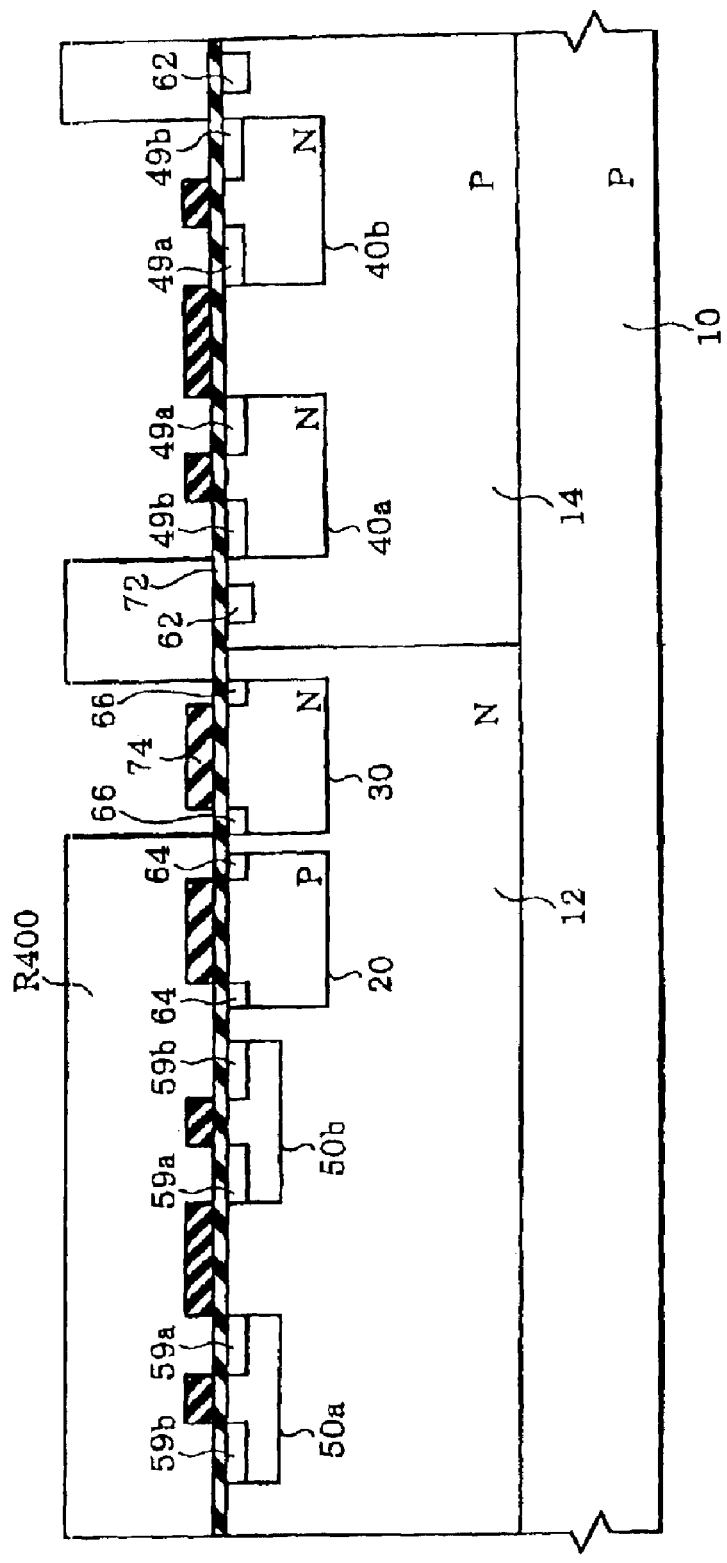
FIG. 7 shows a cross-sectional view illustrating the method for manufacturing a semiconductor device in the process order in accordance with the embodiment of the present invention.

(G) As shown in FIG. 7, for example, phosphorus ions are implanted in the semiconductor substrate 10 using a resist layer R400 and the silicon nitride layer 74 as masks to form N-type impurity layers. The impurity layers that are formed in this step compose N-type second offset layers 49a, shallow impurity layers 49b adjacent to the source/drain layers, and channel stopper layers 66 in the fourth well 30.

Figure 8:
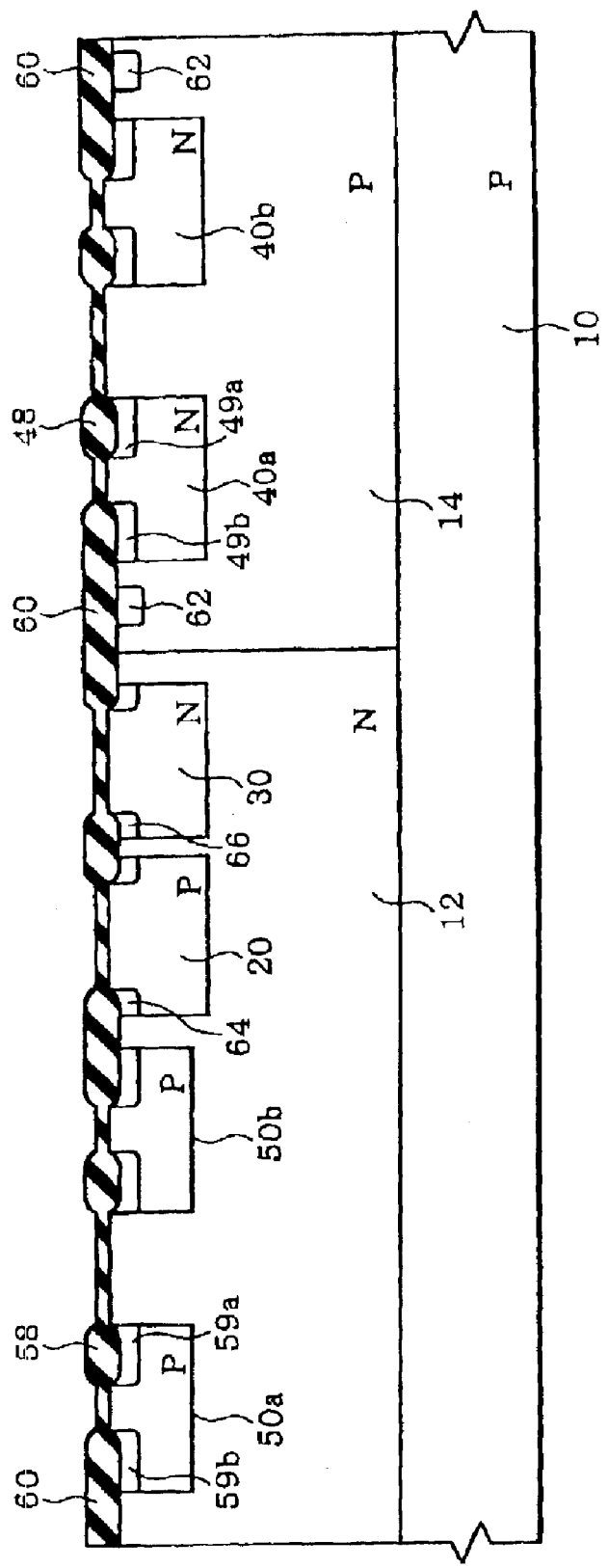
FIG. 8 shows a cross-sectional view illustrating the method for manufacturing a semiconductor device in the process order in accordance with the embodiment of the present invention.

(H) As shown in FIG. 8, after removing the resist layer R400, the semiconductor substrate 10 is thermally oxidized using the silicon nitride layer 74 (FIG. 7) as an anti-oxidation mask to form a LOCOS layer having a thickness of about 500 nm over the semiconductor substrate 10. The LOCOS layer that is formed in this step includes element isolation dielectric layers 60 and dielectric layers for forming offset regions (hereafter referred to as "offset LOCOS layers") 48.

Figure 9:
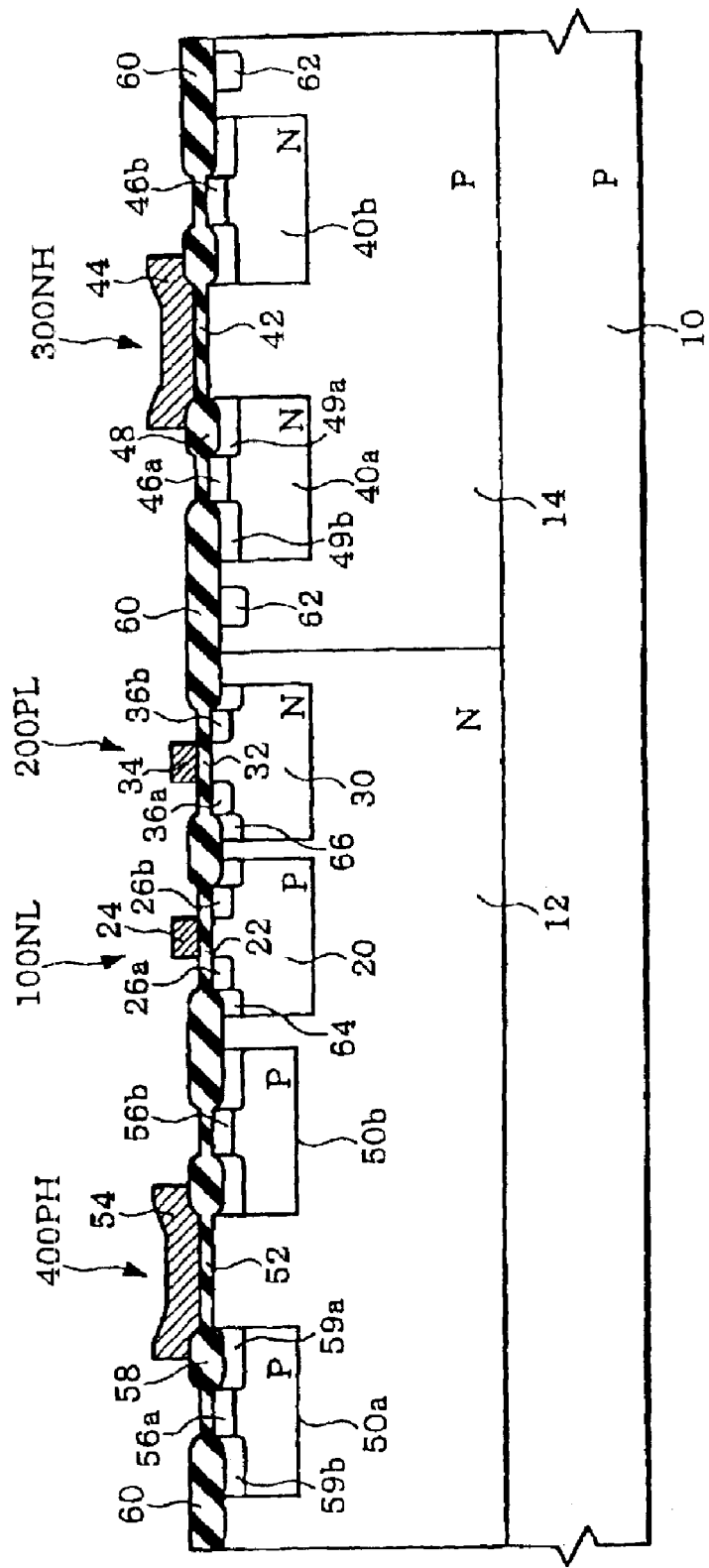
FIG. 9 shows a cross-sectional view illustrating the method for manufacturing a semiconductor device in the process order in accordance with the embodiment of the present invention.

(I) As shown in FIG. 9, gate dielectric layers, gate electrodes and source/drain layers are formed by a known method to form specified transistors. More specifically, low breakdown voltage transistors are formed in the third well 20 and the fourth well 30 that are shallower than the first well 12, and high breakdown voltage transistors are formed in the first well 12 and the second well 14.

More specifically, an N-channel type low breakdown voltage transistor 100NL is formed in the third well 20. The low breakdown voltage transistor 100NL includes source/drain layers 26a and 26b that are composed of N-type impurity layers, a gate dielectric layer 22 and a gate electrode 24.

A P-channel type low breakdown voltage transistor 200PL is formed in the fourth well 30. The low breakdown voltage transistor 200PL includes source/drain layers 36a and 36b that are composed of P-type impurity layers, a gate dielectric layer 32 and a gate electrode 34.

An N-channel type high breakdown voltage transistor 300NH is formed in the second well 14. The high breakdown voltage transistor 300NH includes source/drain layers 46a and 46b that are composed of N-type impurity layers, a gate dielectric layer 42 and a gate electrode 44.

A P-channel type high breakdown voltage transistor 400PH is formed in the first well 12. The high breakdown voltage transistor 400PH includes source/drain layers 56a and 56b that are composed of P-type impurity layers, a gate dielectric layer 52 and a gate electrode 54.

The low breakdown voltage transistors 100NL and 200PL are driven by a driving voltage of, for example, 1.8–5V. The high breakdown voltage transistors 300NH and 400PH are driven by a substantially higher driving voltage as compared to the low breakdown voltage transistors 100NL and 200PL, such as, for example, by a driving voltage of 20–60V. A ratio of the breakdown voltages between the low breakdown voltage transistor 100NL, 200PL and the high breakdown voltage transistor 300NH, 400PH, i.e., (a breakdown voltage of a high breakdown voltage transistor)/(a breakdown voltage of a low breakdown voltage transistor) is, for example, 3–60. Here, the "breakdown voltage" generally means a drain breakdown voltage.

In the present embodiment, the structure of each of the wells is determined based on breakdown voltage and threshold voltage of the transistors provided in each well as well as junction breakdown voltage and punch-through breakdown voltage between the wells.

Next, impurity concentrations of the wells are described. The impurity concentration of the third well 20 and fourth well 30 where low breakdown voltage transistors are formed is set higher than the impurity concentration of the first well 12 and the second well 14 where high breakdown voltage transistors are formed. In this way, the impurity concentration of each well can be appropriately set according to the driving voltage and breakdown voltage of each transistor. The impurity concentration of the third well 20 and fourth well 30 is, for example, $4.0 \times 10^{16} - 7.0 \times 10^{17}$ atoms/cm$^3$ in their surface concentration. The impurity concentration of the first well 12 and the second well 14 is, for example, $8.0 \times 10^{15} - 4.0 \times 10^{16}$ atoms/cm$^3$ in their surface concentration.

With respect to the well depth, in view of the well breakdown voltage, the third well 20 and the fourth well 30 where low breakdown voltage transistors are formed are formed shallower than the first well 12 and the second well 14 where high breakdown voltage transistors are formed. For example, the first well 12 has a depth of 10–20 μm, and the third well 20 and the fourth well 30 have a depth of 2–10 μm. As the depth of the first well 12 is compared to the depth of the third well 20 and the fourth well 30, respectively, a depth ratio of the two is for example 2–5, respectively. Also, the depth of the N-type first offset layers 40a and 40b that are formed through the same thermal process for the third well 20 and the fourth well 30 is generally the same as the depth of the third well 20 and the fourth well 30.

Each of the high breakdown voltage transistors 300NH and 400PH shown in FIG. 9 may have a so-called offset gate structure in which its gate electrode does not overlap its source/drain layers. In an example described below, each high breakdown voltage transistor has a LOCOS offset structure and a double diffused drain structure. More specifically, in each of the high breakdown voltage transistors, an offset region is provided between a gate electrode and source/drain layers. The offset region is composed of a deep low concentration impurity layer that composes the double diffused drain structure (first offset layer) and a low concentration impurity layer that composes the LOCOS offset structure (second offset layer)

The N-channel type high breakdown voltage transistor 300NH includes the offset LOCOS layer 48 provided around the gate dielectric layer 42, the second offset layer 49a that is composed of an N-type low concentration impurity layer formed below the offset LOCOS layer 48, the N-type low concentration shallow impurity layer 49b formed below the element isolation dielectric layer 60, and the first offset layers 40a and 40b that are deeper than the second offset layer 49a and the low concentration shallow impurity layer 49b.

The P-channel type high breakdown voltage transistor 400PH includes the offset LOCOS layer 58 provided around the gate dielectric layer 52, the second offset layer 59a that is composed of a P-type low concentration impurity layer formed below the offset LOCOS layer 58, the P-type low concentration impurity layer 59b formed below the element isolation dielectric layer 60, and the first offset layers 50a and 50b that are deeper than the second offset layer 59a and the low concentration impurity layer 59b.

Due to the fact that each of the high breakdown voltage transistors has a LOCOS offset structure and a double diffusion drain structure, and therefore has a high drain breakdown voltage, a high breakdown voltage MOSFET can be formed. In other words, by providing a second offset layer below an offset LOCOS layer, the second offset layer can be made relatively deep against the channel region, compared to a case without the offset LOCOS layer. As a result, when the transistor is in an OFF state, a deep depletion layer can be formed due to the second offset layer, and a drain breakdown voltage can be increased as the electric field at the drain is alleviated. Also, the first offset layer can further alleviate the electric field adjacent to the drain.

Also, since the third well 20 and the fourth well 30 are formed within the first well 12, they are electrically isolated from the semiconductor substrate 10. As a result, bias conditions can be independently set for the third and fourth wells 20 and 30. In other words, driving voltages can be set for the third well 20 and the fourth well 30 independently of the substrate potential Vsub of the semiconductor substrate 10. Therefore, by setting driving voltages V1 and V2 for the low breakdown voltage transistors 100NL and 200PL between driving voltages V3 and V4 for the high breakdown voltage transistors 300NL and 400PL, a level shift circuit that converts a driving voltage level for a low breakdown voltage transistor to a driving voltage level for a high breakdown voltage transistor can be effectively and readily designed.

By the manufacturing method in accordance with the present embodiment, by the heat treatment in step (C), impurities in the impurity layers 200 and 300 and the impurity layers 400a and 400b are diffused, such that the P-type third well 20, the N-type fourth well 30, and the N-type first offset layers 40a and 40b can be simultaneously formed, and thus the number of manufacturing steps can be reduced.

By the manufacturing method in accordance with the present embodiment, the first well 12 where the high breakdown voltage transistor 400PH is formed, and the third well 20 and the fourth well 30 where the low breakdown voltage transistors 100NL and 200PL are formed, are formed in different ion implantation steps and different drive-in steps with different heat treatments. Therefore the third well 20 and the fourth well 30 can be designed independently of the first well 12. As a result, the third well 20 and the fourth well 30 can be formed shallower to accommodate size-reduction and increased speeds of low breakdown voltage transistors, and also the area of the well can be reduced, such that the degree of integration of the third and fourth wells 20 and 30 can be improved to higher levels.

The present invention is not limited to the embodiment described above, and many modifications can be made within the scope of the subject matter of the present invention. For example, the embodiments described above shows examples in which the first conductivity type is P-type and the second conductivity type is N-type. However, these conductivity types may be reversed if desired. Also, the layer structure or plan structure of the semiconductor device can be different from those of the embodiment described above depending on the desired design.

The entire disclosure of Japanese Patent Application No. 2002-081189 filed Mar. 22, 2002 is incorporated by reference.

What is claimed:

1. A method for manufacturing a semiconductor device, comprising:
   forming a first well in a semiconductor substrate;
   forming a second well in the first well, the second well being shallower than the first well;
   forming a third well in the first well, the third well being shallower than the first well;
   forming a first high break down voltage transistor in the first well;
   forming a first low break down voltage transistor in the second well; and forming a second low break down voltage transistor in the third well.

2. The method for manufacturing a semiconductor device according to claim 1, comprising:

forming a first channel stopper layer around the first low break down transistor by implanting an impurity of a first conductivity type;

wherein the step of forming the first high break down voltage transistor comprises forming first offset layers by implanting an impurity of the first conductivity type; and wherein implanting the impurity in the step of forming the first channel stopper layer and implanting the impurity in the step of forming the first offset layers are performed in the same step.

3. The method of manufacturing a semiconductor device according to claim 2, comprising:

forming a fourth well adjacent to the first well;

forming a second high break down voltage transistor in the fourth well; and forming a second channel stopper layer around the second high break down voltage transistor by implanting an impurity of the first conductivity type;

wherein implanting the impurity in the step of forming the second channel stopper layer, implanting the impurity in the step of forming the first offset layers, and implanting the impurity in the step of forming the first channel stopper layer are performed in the same step.

4. A semiconductor device, comprising:

a substrate;

a first well formed in the substrate;

a second well formed in the first well, the second well being shallower than the first well;

a third well formed in the first well, the third well being shallower than the first well;

a first high break down transistor formed in the first well;

a first low break down transistor formed in the second well; and a second low break down transistor formed in the third well.

5. A semiconductor device according to claim 4, wherein the first high break down transistor comprises a first offset layer, a second offset layer in the first offset layer and a first offset LOCOS layer.

6. A semiconductor device according to claim 5, comprising:

a fourth well formed adjacent to the first well; and a second high break down transistor formed in the second well.

7. A semiconductor device according to claim 6, wherein the second high break down transistor comprises a third offset layer, a fourth offset layer formed in the third offset layer and a second offset LOCOS layer.

8. A semiconductor device according to claim 6, comprising:

a first channel stopper layer formed around a forming region of the second high break down transistor, a second channel stopper layer formed around a forming region of the first low break down transistor and a third channel stopper layer formed around a forming region of the second low break down transistor.

* * * * *